(12) United States Patent
Bringivijayaraghavan et al.

(10) Patent No.: US 9,721,628 B1
(45) Date of Patent: Aug. 1, 2017

(54) ADDRESS BASED MEMORY DATA PATH PROGRAMMING SCHEME

(71) Applicant: GLOBALFOUNDRIES INC., Grand Cayman (KY)

(72) Inventors: Venkatraghavan Bringivijayaraghavan, Cheyyar (IN); George M. Braceras, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/266,261

(22) Filed: Sep. 15, 2016

(51) Int. Cl.
| | | |
|---|---|---|
| G11C 7/08 | (2006.01) | |
| G11C 7/22 | (2006.01) | |
| G11C 7/06 | (2006.01) | |
| G11C 8/10 | (2006.01) | |
| G11C 7/10 | (2006.01) | |
| G11C 8/08 | (2006.01) | |

(52) U.S. Cl.
CPC ............... *G11C 7/22* (2013.01); *G11C 7/065* (2013.01); *G11C 7/10* (2013.01); *G11C 8/08* (2013.01); *G11C 8/10* (2013.01)

(58) Field of Classification Search
CPC .................................. G11C 7/08; G11C 7/10
USPC ............................................ 365/189.02, 205
See application file for complete search history.

(56) References Cited

U.S. PATENT DOCUMENTS

| | | | |
|---|---|---|---|
| 5,353,431 A | 10/1994 | Doyle et al. | |
| 5,416,740 A | 5/1995 | Fujita et al. | |
| 5,991,233 A * | 11/1999 | Yu ........................ | G11C 7/1072 365/189.05 |
| 6,621,751 B1 | 9/2003 | Abedifard et al. | |
| 9,236,116 B1 | 1/2016 | Braceras et al. | |
| 2003/0063488 A1* | 4/2003 | Kasai ..................... | G11C 11/22 365/145 |
| 2004/0076045 A1* | 4/2004 | Hira ....................... | G11C 7/06 365/200 |
| 2004/0114439 A1* | 6/2004 | Gogl ...................... | G11C 11/16 365/189.15 |
| 2008/0273406 A1 | 11/2008 | Behrends et al. | |
| 2008/0291746 A1* | 11/2008 | Sunaga .................. | G11C 7/08 365/189.05 |
| 2010/0128539 A1* | 5/2010 | Kobayashi ............ | G11C 7/1045 365/189.05 |
| 2010/0165718 A1* | 7/2010 | Park ...................... | G11C 11/56 365/163 |
| 2015/0235675 A1* | 8/2015 | Yu ......................... | G11C 5/06 365/51 |
| 2015/0318033 A1* | 11/2015 | Kajigaya .............. | G11C 11/1673 714/764 |
| 2016/0064044 A1* | 3/2016 | Stansfield ............. | G11C 7/12 365/189.15 |

(Continued)

FOREIGN PATENT DOCUMENTS

DE      4241327      6/1993

*Primary Examiner* — Michael Tran
(74) *Attorney, Agent, or Firm* — Gibb & Riley, LLC; Anthony J. Canale

(57) ABSTRACT

Data paths are provided to a memory array. The data paths include switches for selectively aligning the data paths to different multiplexors for reading or writing to the memory array. Read data lines are steered to selected sense amplifiers based on the decode address, using the switches. Write data lines are steered to selected write drivers based on the decode address, using the switches.

19 Claims, 7 Drawing Sheets

(56) References Cited

U.S. PATENT DOCUMENTS

2016/0172028 A1* 6/2016 Park .................. G11C 13/0026
365/148

* cited by examiner

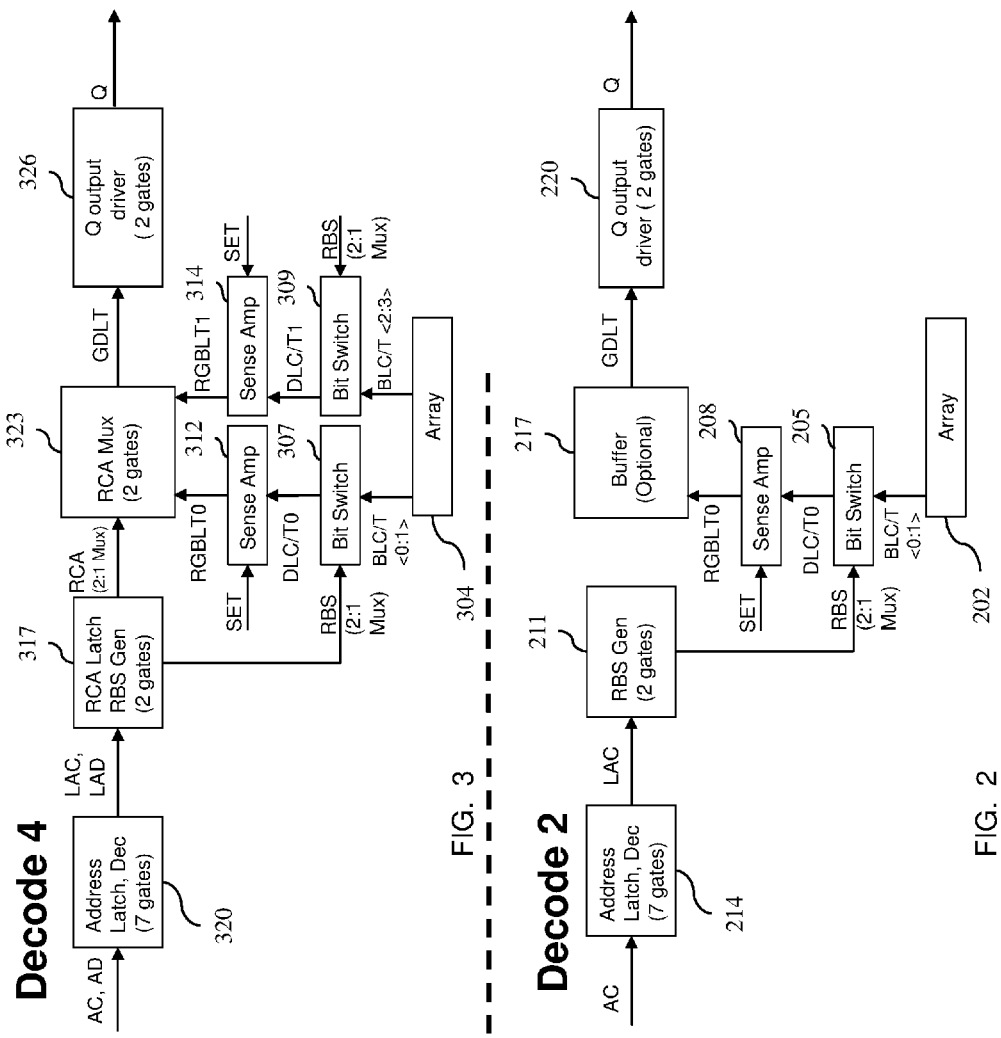

ADDRESS BASED MEMORY DATA PATH PROGRAMMING SCHEME

BACKGROUND

The present disclosure relates to semiconductor structures, and, more specifically, to memory cells with read schemes and writes schemes, and methods of use.

Random access memory (RAM) may be static or dynamic. SRAM is a type of semiconductor memory that uses bistable latching circuitry to store each bit. The term static differentiates it from dynamic RAM (DRAM), which must be periodically refreshed. An SRAM cell has three different states: standby, read and write. The SRAM to operate in read mode and write mode should have "readability" and "write stability" respectively.

Current Decode Address Schemes for reading a memory requires multiplexing and Read Column Address (RCA) timing to properly access the correct memory bit. In addition, Current Decode Address Schemes for writing to a memory require multiple levels of decoding.

SUMMARY

Methods and systems herein provide an efficient data path structure for a compilable memory implementing several multiplex options while utilizing physical design constructs in combination with logical elements. A data path programming scheme is provided that is based on the decode address. All decoding is done at the bitswitch level via programming for all decodes. The programming scheme eliminates the influence of RCA timing on the data output from memory (Q) and thereby enhances memory performance. It also eliminates performance variation due to the decode address (AD), thereby simplifying timing rules generation. That is, decode 2 and decode 4 timings will be identical, so timing characterization effort is reduced. This provides faster access time to the memory and a lower setup time, which improves the AD based cycle time.

According to a structure herein, the structure includes a memory array and a read data path. The read data path includes a pair of read bit switches connected to the memory array and a pair of sense amps connected to the read bit switches. A first sense amp of the pair of sense amps is connected directly to a first read bit switch of the pair of read bit switches. A second sense amp of the pair of sense amps is connected to a second read bit switch of the pair of read bit switches through a switch. The switch provides a data path from the second read bit switch of the pair of read bit switches to the first sense amp of the pair of sense amps.

According to a structure herein, the structure includes a memory array, a pair of write drivers connected to the memory array, and a steering de-multiplexor connected to the pair of write drivers. The steering de-multiplexor is directly connected to a first write driver of the pair of write drivers. The steering de-multiplexor is directly connected to a second write driver of the pair of write drivers through switches. The switches provide a path from the steering de-multiplexor to both the first write driver of the pair of write drivers and the second write driver of the pair of write drivers or a first path from the steering de-multiplexor to the first write driver of the pair of write drivers and a second path from the steering de-multiplexor to the second write driver of the pair of write drivers.

According to a memory herein, a memory array is provided. Data paths are provided to the memory array. The data paths include switches for selectively aligning the data paths to different multiplexors for reading or writing to the memory array. Read data lines are steered to selected sense amplifiers based on the decode address, using the switches. Write data lines are steered to selected write drivers based on the decode address, using the switches.

BRIEF DESCRIPTION OF THE DRAWINGS

The systems and methods herein will be better understood from the following detailed description with reference to the drawings, which are not necessarily drawn to scale and in which:

FIG. 2 is a block diagram illustrating current reading of a memory using Decode 2;

FIG. 3 is a block diagram illustrating current reading of a memory using Decode 4;

DETAILED DESCRIPTION

Figure 1:
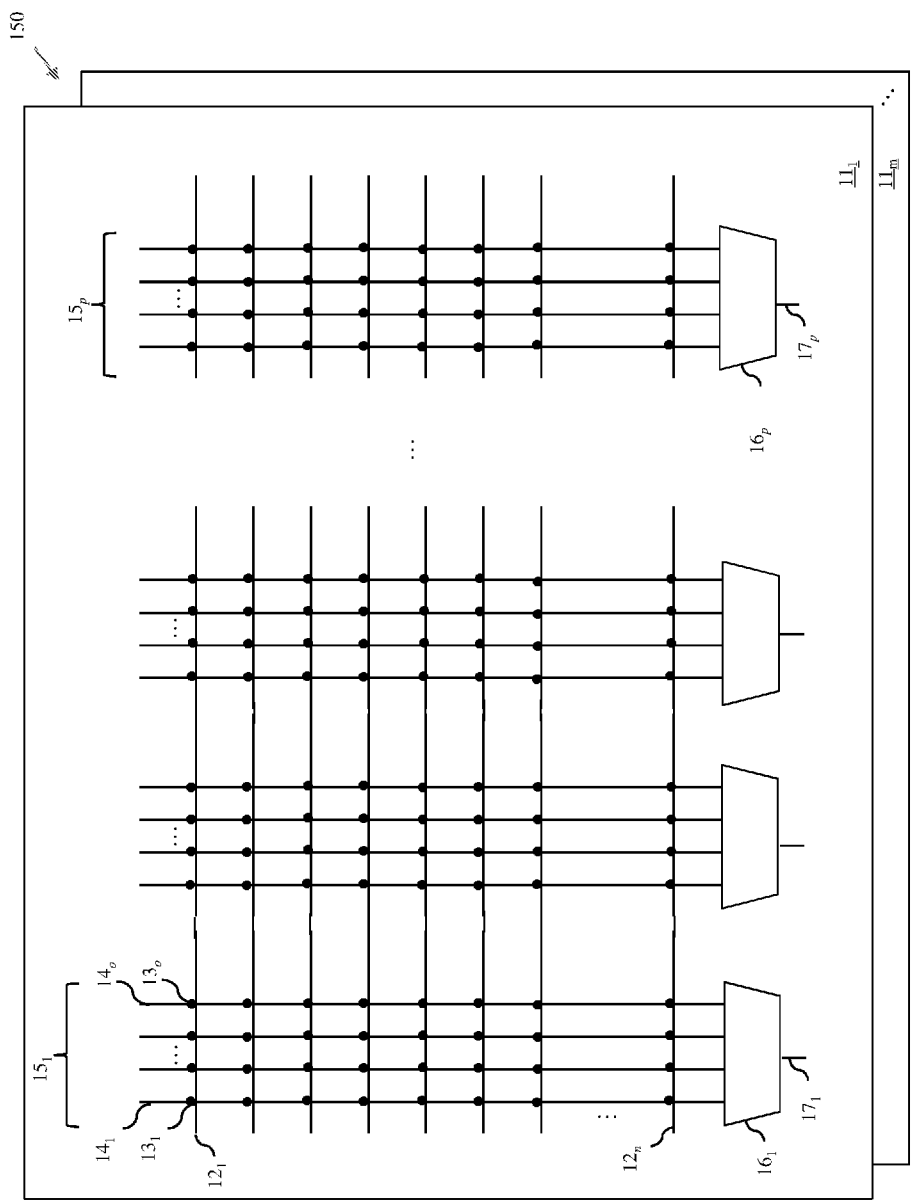
FIG. 1 is a schematic drawing illustrating an exemplary memory on an integrated circuit chip.

It will be readily understood that the systems and methods of the present disclosure, as generally described and illustrated in the drawings herein, may be arranged and designed in a wide variety of different configurations in addition to the systems and methods described herein. Thus, the following detailed description of the systems and methods, as represented in the drawings, is not intended to limit the scope defined by the appended claims, but is merely representative of selected systems and methods. The following description is intended only by way of example, and simply illustrates certain concepts of the systems and methods, as disclosed and claimed herein.

Referring FIG. 1, disclosed herein are embodiments of an integrated circuit chip having a plurality of memories 150. More particularly, each of the memories 150 can include one or more memory banks $11_1$-$11_m$, where the number m is the total number of banks and where each bank is essentially identical. Each memory bank $11_1$-$11_m$ can include one or more word lines $12_1$-$12_n$ (corresponding to rows), where the number n is the total number of word lines per bank. Each memory bank $11_1$-$11_m$ can also include one or more data bit columns $15_1$-$15_p$, where the number p is the total number of data bit columns per bank and where the data bit columns are essentially identical. Each data bit column $15_1$-$15_p$ can traverse the word lines $12_1$-$12_n$ so as to incorporate adjacent sections of the word lines $12_1$-$12_n$. Each data bit column $15_1$-$15_p$ can further include one or more memory cells $13_1$-$13_o$ electrically connected to each of those adjacent sections of the word lines $12_1$-$12_n$ and one or more bit lines $14_1$-$14_o$ (corresponding to columns) electrically connected to the memory cells $13_1$-$13_o$, respectively, at the adjacent sections of the word lines $12_1$-$12_n$. Thus, the number o corresponds to the number of memory cells electrically connected to each adjacent section of each word line in a data bit column as well as the corresponding number of bit lines connected to the memory cells in the data bit column. This number o is referred to herein as the decode number (i.e., a decode o). Each data bit column $15_1$-$15_p$ can, in the case of multiple bit lines (i.e., multiple columns) per data bit column, further include a corresponding multiplexer $16_1$-$16_p$ that receives, as inputs, signals from the bit lines $14_1$-$14_o$ and outputs a single data bit $17_1$-$17_p$, respectively. In such a memory, the number p of data bit columns is the same as the number p of single data bits output and is referred to as the data bit width. In order to read or write to the memory, a memory address of a set number of bits including bank address bits, which specify a particular one of the banks $11_1$-$11_m$, as well as word address bits and decode address bits, which in combination specify the same memory cell (i.e., the same particular word line and bit line intersection) to be accessed (i.e., read from or written to) in each of the data bit columns. The actual total address space is equal to the number m of banks multiplied by the number n of word lines per bank multiplied by the decode number o per data bit column.

The integrated circuit chip can include any number of two or more memories 150. The memories 150 can be the same type of memories and can be configured, for example, as illustrated in FIG. 1. The memories 150 can all be dynamic random access memory (DRAM) arrays, static random access memory (SRAM) arrays, or any other specific type of memory arrays, such as an embedded dynamic random access memory (eDRAM) array, a magnetoresistive random access memory (MRAM), a flash memory array, etc. Each of these memories can further be associated with a predetermined maximum address space. For example, current state-of-the-art SRAM arrays have a maximum possible size of 16 banks, 512 word lines per bank and a decode number of 32 (i.e., a decode 32) and, thereby a maximum possible address space of 256,000 addresses.

These memories 150 can have the exact same configuration (e.g., the same number of banks, the same number of word lines per bank and the same decode number per data bit column such that they each have the same total address space. Alternatively, any two or more of the memories 150 can have different configurations (e.g., different numbers of banks, different numbers of word lines per bank and/or different decode numbers per data bit column) such that they have different total address spaces. For example, the memories 150 can all include SRAM arrays; however, one memory 150 can have 2 banks, each with 256 word lines and a decode number of 8 for a total address space of 4096 addresses; another memory 150 can have 8 banks, each with 128 word lines and a decode number of 4 for a total address space of 4096 addresses; and yet another memory 150 can have 4 banks, each with 16 word addresses and a decode number of 16 for a total address space of 1024 addresses. These are just examples. Any configuration of memories 150 can be used, as would be known by one of ordinary skill in the art.

According to an embodiment, a memory array is provided. Data paths are provided to the memory array. The data paths include switches for selectively aligning the data paths to different multiplexors for reading or writing to the memory array. Read data lines are steered to selected sense amplifiers based on the decode address, using the switches. Write data lines are steered to selected write drivers based on the decode address, using the switches.

FIG. 2 shows an exemplary read decode address scheme for a typical memory array 202, using decode 2, i.e., each piece of data having two bits. The bit switch 205 provides multiplexing of the data by which a single bit is passed to the sense amp 208. The sense amp 208 is controlled by a sense amp enable signal (SET). The bit switch 205 receives control input from the read bit switch (RBS) signal 211 for 2-to-1 multiplexing based on the address latch decision block 214. In other words, the column address (AC) is used as input to the address latch decision block 214, which identifies the latched column address (LAC) to the RBS 211. The sense amp 208 can pass the global bit line that has been read (RGBLT0) to an optional buffer 217 to output the data at 220.

FIG. 3 shows a similar path for an exemplary read decode address scheme for a typical memory array 304, using decode 4, i.e., each piece of data having four bits. In this case, two bits are provided to each bit switch 307, 309. The bit switches 307, 309 provide multiplexing of the two bits by which a single bit is passed to each sense amp 312, 314. As above, the sense amps 312, 314 are controlled by a sense amp enable signal (SET). The bit switches 307, 309 receive control input from the read bit switch (RBS) signal for 2-to-1 multiplexing in each bit switch 307, 309 based on the address latch decision block 320. In this case, both the column address (AC) and the address decode (AD) are used together as input to the address latch decision block 317, which identifies the latched column address (LAC) and latched address decode (LAD) to the RBS to choose which column to read. The sense amps 312, 314 can pass the global bit line that has been read RGBLT0 and RGBLT1 to a timing multiplexor 323, which uses a read column address (RCA) timing signal to coordinate the global data line (GDLT) for output at 326. In the decode 4 scheme, RCA arrival time becomes critical with respect to the timing of RGBLT0 and RGBLT1. If the RCA signal arrives too soon, then Q hold is reduced. If the RCA signal arrives too late, then Q arrival is delayed resulting in an access time penalty. Note the decode address (AD) is first latched by a function select (FSEL) internal clock and later latched by the sense amp enable signal (SET).

Figure 4:
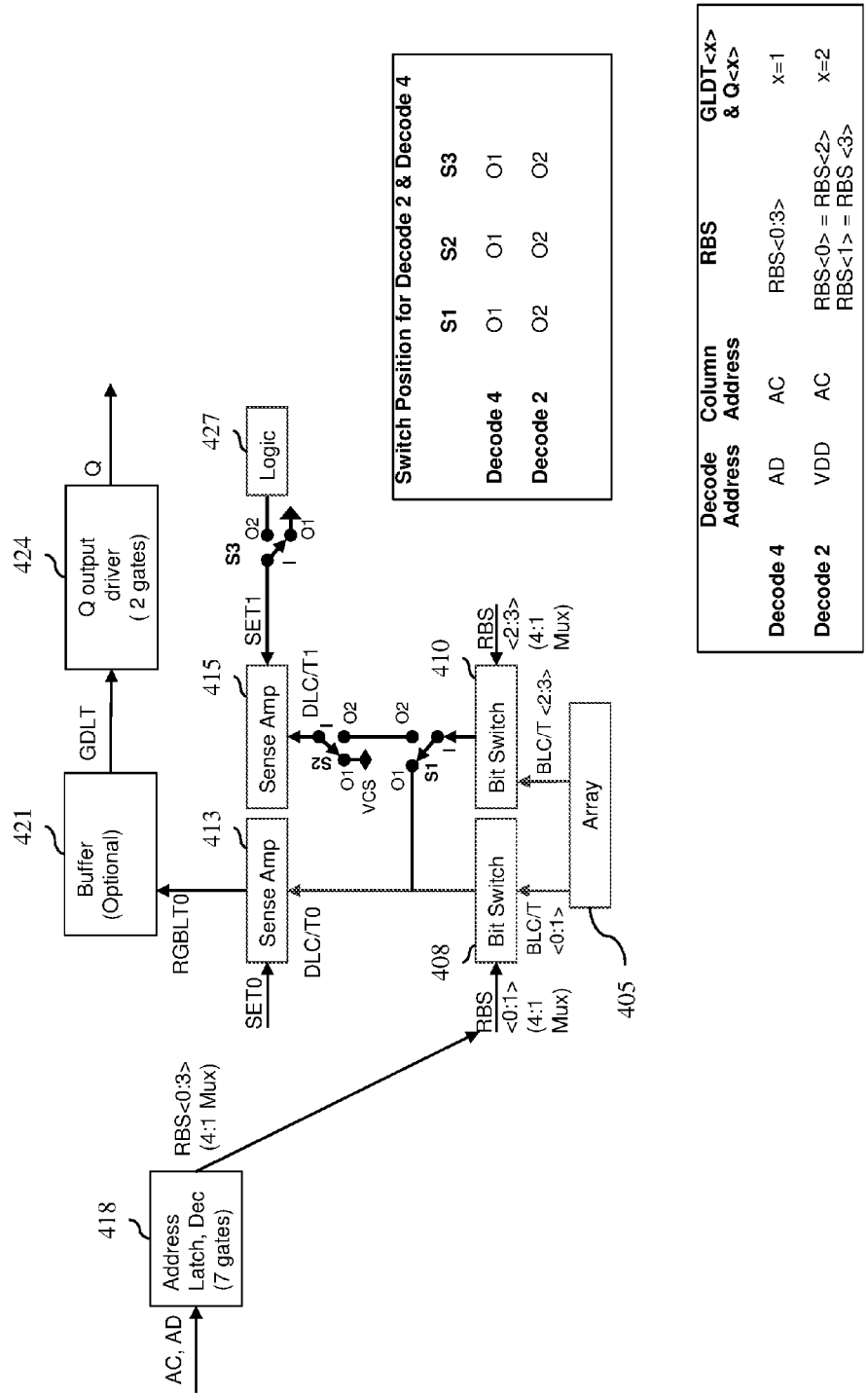
FIG. 4 is block diagram illustrating read memory decoding according to systems and methods herein.

Referring to FIG. 4, a read decode address programming scheme according to methods herein, is shown. In the illustrated program scheme, the column address (AC) and the address decode (AD) are combined to create the read bit switch RBS<0:3> signal for 4:1 multiplexing. Two RBS signals are active in decode 2 and one RBS signal is active in decode 4, in which case RGBLT1 is ignored.

The example in FIG. 4 shows an array 405, which may be either established for decode 2 or decode 4. According to devices and methods herein, the array 405 may be established for any decode number o per data bit column, as described above. As shown in FIG. 4, two bits are provided to each bit switch 408, 410. The bit switches 408, 410 provide multiplexing of the two bits having a single bit output. Switches S1, S2, and S3 are provided to direct the output of bit switch 410. Note the example in FIG. 4 has the switches S1, S2, and S3 positioned for decode 4. Switch programming can be either physical (i.e., using metal overlays) or logical (i.e., using low Vt devices). Furthermore, in the example of FIG. 4, switches S1 and S2 can be provided as physical switches using metal overlays, and switch S3 can use logical programming. The output of bit switch 408 is passed to sense amp 413. The output of bit switch 410 is also passed to sense amp 413 through switch S1. As above, the sense amps 413, 415 are controlled by a sense amp enable signal (SET). The bit switches 408, 410 receive control input from the read bit switch (RBS) signal for 2-to-1 multiplexing in the bit switches 408, 410 based on the address latch decision block 418. In this case, both the column address (AC) and the address decode (AD) are used together as input to the address latch decision block 418, which identifies the latched column address (LAC) and latched address decode (LAD) to the RBS 317 to choose which column to read. In decode 4, as shown in FIG. 4, the sense amp 413 can pass the global bit line that has been read RGBLT0 to an optional buffer 421 to output the data at 424. In decode 4, RGBLT1 is ignored.

Still referring to FIG. 4, decode 2 is done in a similar manner except the switch positions for switches S1, S2, and S3 are changed, such that the output of bit switch 410 is provided to sense amp 415 for the logic at 427, through switch S3. Note, in decode 2, for the read bit switches, RBS<0>=RBS<2> and RBS<1>=RBS<3>.

In the example of FIG. 4, there is no RCA timing, which means that the timing criticality is eliminated, thereby improving decode performance. In addition, by using the switches S1, S2, and S3, only one level of multiplexing is done for both decode 2 and decode 4, and only one latch for the decode address (AD). Further, only one sense amp enable signal (SET) will be active even during redundancy, which saves power. Note the layout is the same for decode 2 and for decode 4, except for the programming. The layout can be extendable for any decode number.

In other words, the structure includes a memory array and a read data path. The read data path includes a pair of read bit switches connected to the memory array and a pair of sense amps connected to the read bit switches. A first sense amp of the pair of sense amps is connected directly to a first read bit switch of the pair of read bit switches. A second sense amp of the pair of sense amps is connected to a second read bit switch of the pair of read bit switches through a switch. The switch provides a data path from the second read bit switch of the pair of read bit switches to the first sense amp of the pair of sense amps.

Figure 5:
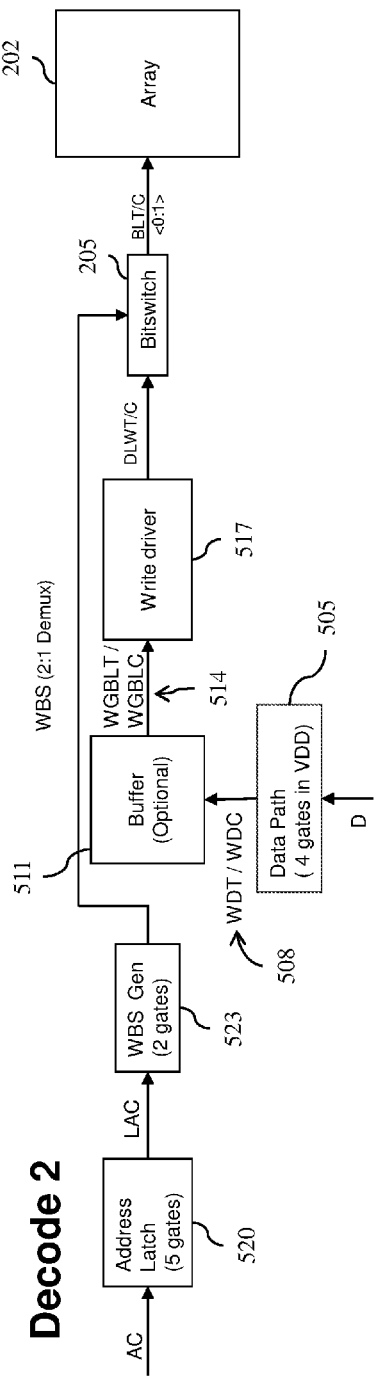
FIG. 5 is a block diagram illustrating current writing of a memory using Decode 2.

FIG. 5 shows an exemplary write decode address scheme for a typical memory array 202, using decode 2, i.e., each piece of data having two bits. The write data, D, comes in from a data path 505 and the Write Data line (WDT/WDC) 508 is provided to an optional buffer 511 and the Write Global Bit line (WGBLT/WGBLC) 514 is provided to a single write driver 517. The output of the write driver 517 goes to bit switch 205, which provides de-multiplexing of the data into the array 202. The bit switch 205 receives control input for 2-to-1 de-multiplexing based on the address latch decision block 520 through the write bit switch (WBS) 523. In other words, the column address (AC) is used as input to the address latch decision block 520, which identifies the latched column address (LAC) to the WBS 523. This provides the de-multiplexing signal to the bit switch 205.

Figure 6:
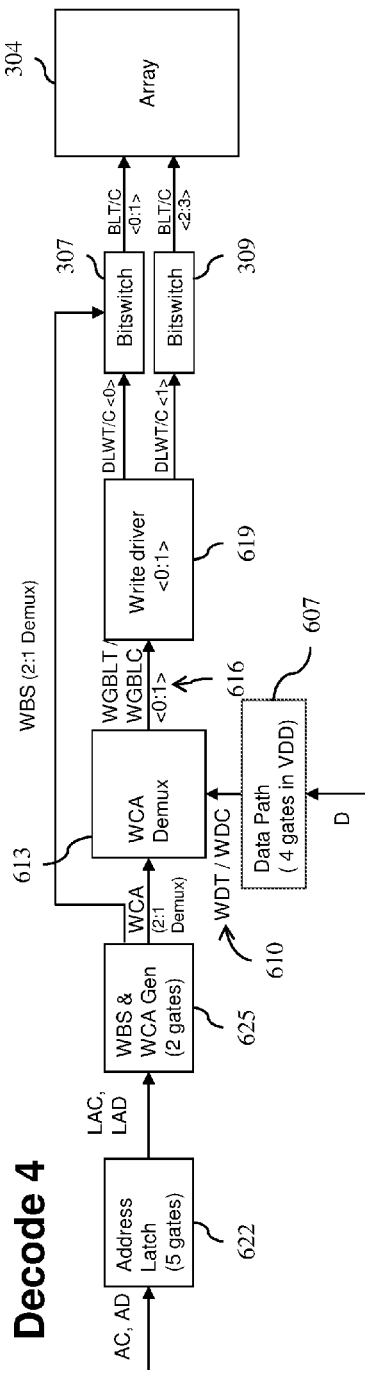
FIG. 6 is a block diagram illustrating current writing of a memory using Decode 4.

FIG. 6 shows a similar path for an exemplary write decode scheme for a typical memory array 304 using decode 4, i.e., each piece of data having four bits. The write data, D, comes in from a data path 607 and the Write Data line (WDT/WDC) 610 is provided to a 2-to-1 write column address (WCA) de-multiplexing unit 613. The Write Global Bit line (WGBLT/WGBLC) 616 is provided to the write driver 619. In this case, the output of the write driver 619 goes to bit switches 307, 309, which provides de-multiplexing of the data into the array 304. In this example in FIG. 6, two bits are provided to each bit switch 307, 309. The bit switches 307, 309 provide de-multiplexing of the two bits. The bit switches 307, 309 receive control input for 2-to-1 de-multiplexing based on the address latch decision block 622 through the write bit switch (WBS) 625. Both the column address (AC) and the address decode (AD) are used together as input to the write bit switch (WBS), which provides input for 2-to-1 de-multiplexing to the write column address (WCA) de-multiplexing unit 613 and bit switches 307, 309. Note, for write decode 4, as shown in FIG. 6, there are two levels of de-multiplexing.

Figure 7:
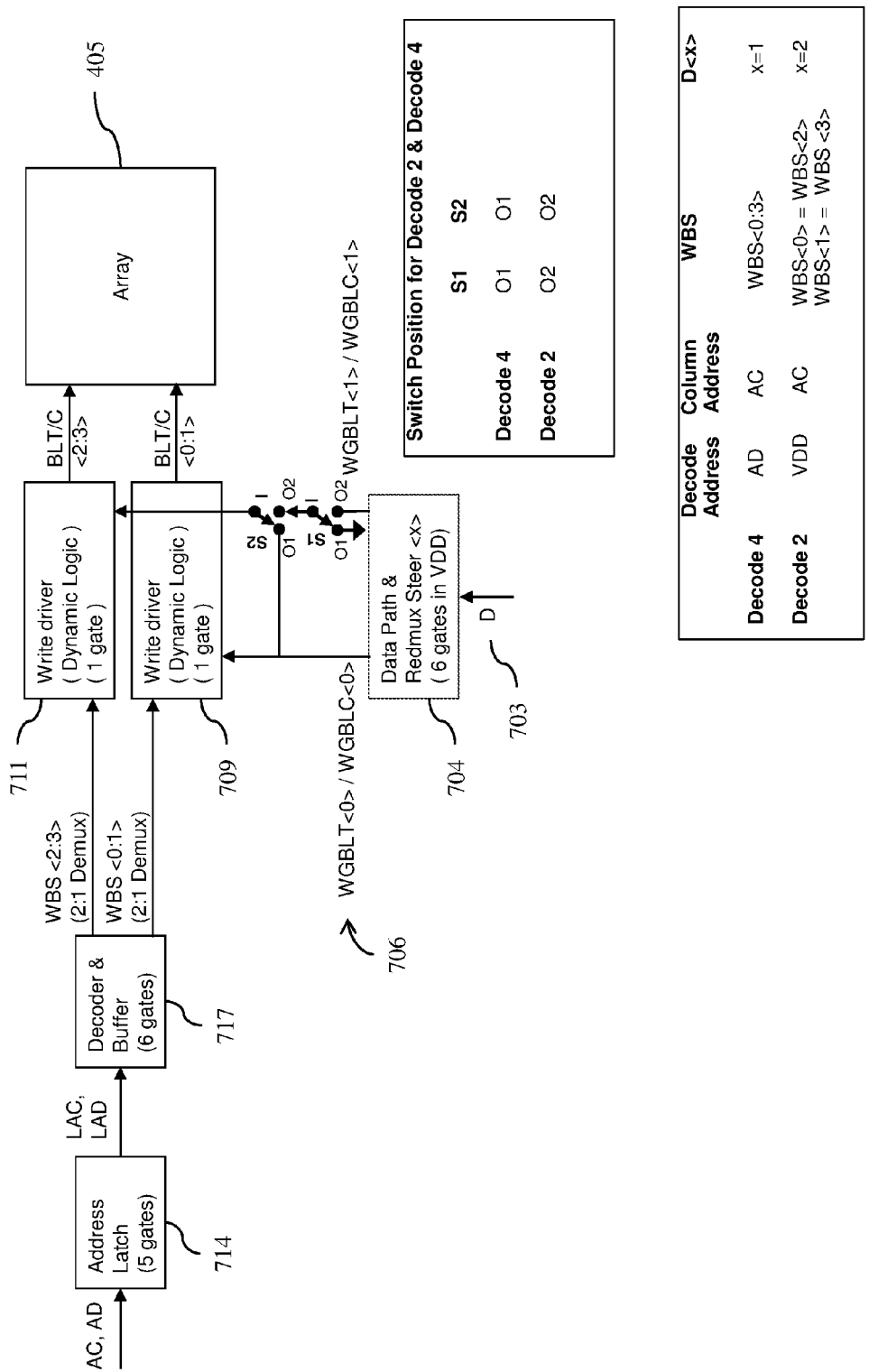
FIG. 7 is block diagram illustrating writing to a memory according to systems and methods herein.

Referring to FIG. 7, a write decode address programming scheme according to methods herein, is shown. In the illustrated program scheme, the column address (AC) and the address decode (AD) are combined to create the WBS<0:3> signal for 4:1 de-multiplexing. Two WBS signals are active in decode 2 and one WBS signal is active in decode 4, in which case WGBLT1 is ignored.

The example in FIG. 7 shows the array 405, which may be either established for decode 2 or decode 4. According to devices and methods herein, the array 405 may be established for any decode number o per data bit column, as described above. As shown in FIG. 7, the write data, D, comes in on a data path 703 from a steering de-multiplexor 704 and the Write Global Bit line (WGBLT/WGBLC) 706 is provided to write drivers 709, 711. Switches S1 and S2 are provided to direct the data to one or both of the write drivers 709, 711. Note the example in FIG. 7 has the switches S1 and S2 positioned for decode 4. Furthermore, in the example of FIG. 7, switches S1 and S2 can be provided as physical switches using, for example, metal overlays or as logical switches. The output of the write drivers 709 (and 711) goes into the array 405.

In this case, both the column address (AC) and the address decode (AD) are used together as input to the address latch decision block 714, which identifies the latched column address (LAC) and latched address decode (LAD) to the decoder 717 which provides the de-multiplexing signal for write drivers 709, 711. In decode 4, as shown in FIG. 7, the data D is passed only in WGBLT0 to write driver 709 and to the array 405. In decode 4, WGBLT1 is ignored.

Still referring to FIG. 7, decode 2 is done in a similar manner except the switch positions for switches S1 and S2 are changed, such that the output of data path 703 is provided to both write drivers 709, 711. Note, in decode 2, for the write bit switches, WBS<0>=WBS<2> and WBS<1>=WBS<3>.

In the example of FIG. 7, by using the switches S1 and S2, only one level of de-multiplexing is done for both decode 2 and decode 4. Note the layout is the same for decode 2 and for decode 4, except for the programming. The layout can be extendable for any decode number.

In other words, the structure includes a memory array, a pair of write drivers connected to the memory array, and a steering de-multiplexor connected to the pair of write drivers. The steering de-multiplexor is directly connected to a first write driver of the pair of write drivers. The steering de-multiplexor is directly connected to a second write driver of the pair of write drivers through switches. The switches provide a path from the steering de-multiplexor to both the first write driver of the pair of write drivers and the second write driver of the pair of write drivers or a first path from the steering de-multiplexor to the first write driver of the pair of write drivers and a second path from the steering de-multiplexor to the second write driver of the pair of write drivers.

Figure 8:
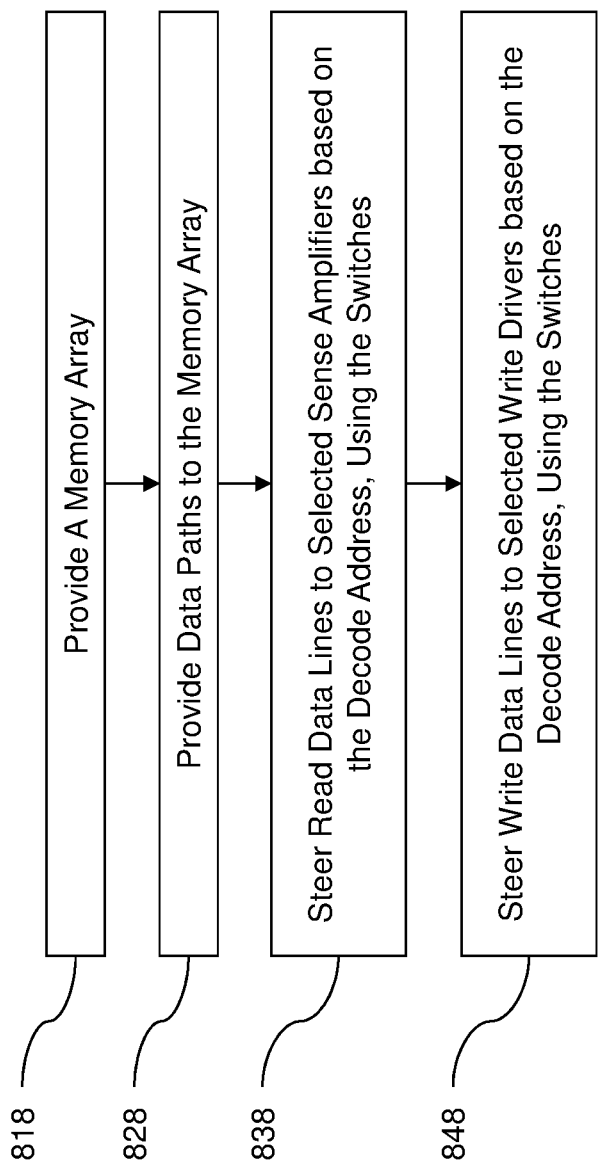
FIG. 8 is a flow diagram illustrating systems and methods herein.

FIG. 8 is a flow diagram illustrating the processing flow of an exemplary method according to systems and methods herein. At 818, a memory array is provided. At 828, data paths are provided to the memory array. The data paths include switches for selectively aligning the data paths to different multiplexors for reading or writing to the memory array. At 838, read data lines are steered to selected sense amplifiers based on the decode address, using the switches. At 848, write data lines are steered to selected write drivers based on the decode address, using the switches.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

Aspects of the present disclosure are described herein with reference to flowchart illustrations and/or block diagrams of methods, apparatus (systems), and computer program products according to various systems and methods. It will be understood that each block of the flowchart illustrations and/or two-dimensional block diagrams, and combinations of blocks in the flowchart illustrations and/or block diagrams, can be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

According to a further system and method herein, an article of manufacture is provided that includes a tangible computer readable medium having computer readable instructions embodied therein for performing the steps of the computer implemented methods, including, but not limited to, the method illustrated in FIG. 8. Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. Any of these devices may have computer readable instructions for carrying out the steps of the methods described above with reference to FIG. 8.

The computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Furthermore, the computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In case of implementing the systems and methods herein by software and/or firmware, a program constituting the software may be installed into a computer with dedicated hardware, from a storage medium or a network, and the computer is capable of performing various functions if with various programs installed therein.

Figure 9:
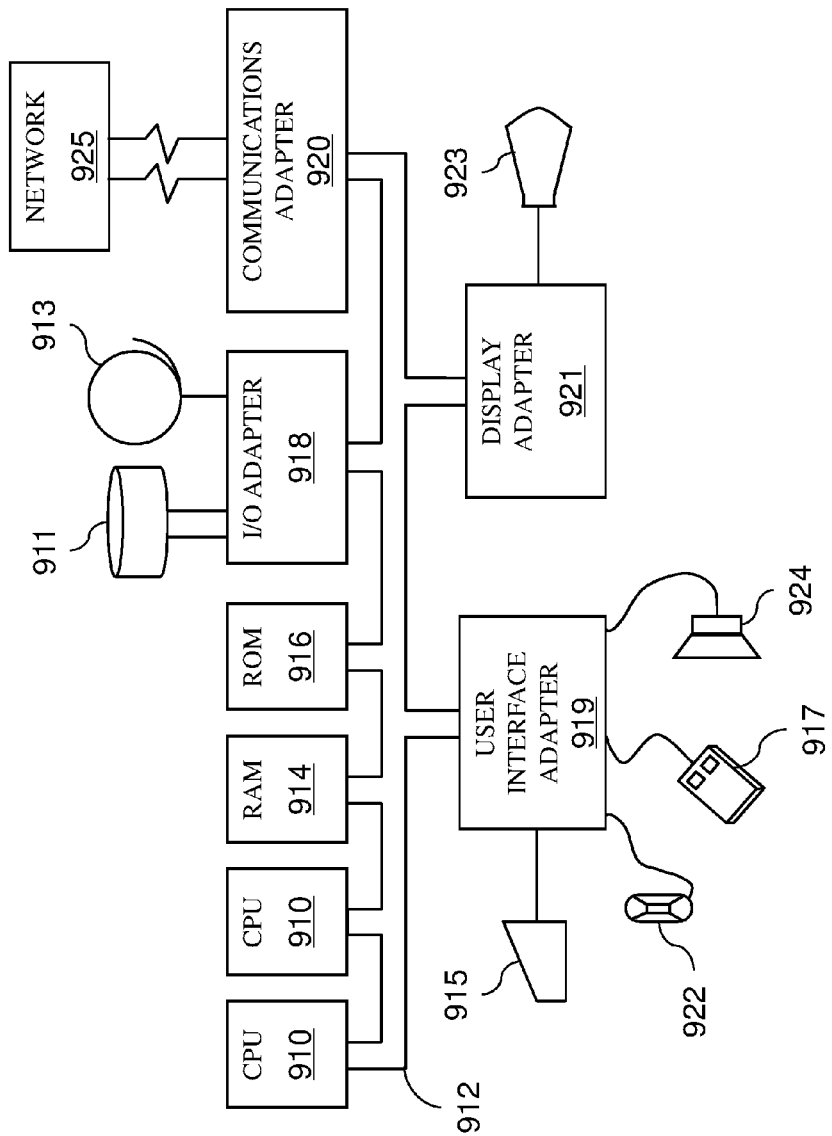
FIG. 9 is a schematic diagram of a hardware system according to systems and methods herein.

A representative hardware environment for practicing the systems and methods herein is depicted in FIG. 9. This schematic drawing illustrates a hardware configuration of an information handling/computer system in accordance with the systems and methods herein. The system includes at least one processor or central processing unit (CPU) 910. The CPUs 910 are interconnected via system bus 912 to various devices such as a Random Access Memory (RAM) 914, Read-Only Memory (ROM) 916, and an Input/Output (I/O) adapter 918. The I/O adapter 918 can connect to peripheral devices, such as disk units 911 and tape drives 913, or other program storage devices that are readable by the system. The system can read the inventive instructions on the program storage devices and follow these instructions to execute the methodology of the systems and methods herein.

In FIG. 9, CPUs 910 perform various processing based on a program stored in a Read Only Memory (ROM) 916 or a program loaded from a peripheral device, such as disk units 911 and tape drives 913 to a Random Access Memory (RAM) 914. In the RAM 914, required data when the CPUs 910 perform the various processing or the like is also stored, as necessary. The CPUs 910, the ROM 916, and the RAM 914 are connected to one another via a bus 912. An I/O adapter 918 is also connected to the bus 912 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 914, as necessary.

The system further includes a user interface adapter 919 that connects a keyboard 915, mouse 917, speaker 924, microphone 922, and/or other user interface devices such as a touch screen device (not shown) to the bus 912 to gather user input. Additionally, a communication adapter 920 including a network interface card such as a LAN card, a modem, or the like connects the bus 912 to a data processing network 925. The communication adapter 920 performs communication processing via a network such as the Internet. A display adapter 921 connects the bus 912 to a display device 923, which may be embodied as an output device such as a monitor (such as a Cathode Ray Tube (CRT), a Liquid Crystal Display (LCD), or the like), printer, or transmitter, for example.

In the case where the above-described series of processing is implemented with software, the program that constitutes the software may be installed from a network such as the Internet or a storage medium such as the removable medium.

Those skilled in the art would appreciate that the storage medium is not limited to the peripheral device having the program stored therein as illustrated in FIG. 9, which is distributed separately from the device for providing the program to the user. Examples of a removable medium include a magnetic disk (including a floppy disk), an optical disk (including a Compact Disk-Read Only Memory (CD-ROM) and a Digital Versatile Disk (DVD)), a magneto-optical disk (including a Mini-Disk (MD) (registered trademark)), and a semiconductor memory. Alternatively, the storage medium may be the ROM 916, a hard disk contained in the storage section of the disk units 911, or the like, which has the program stored therein and is distributed to the user together with the device that contains them.

As will be appreciated by one skilled in the art, aspects of the systems and methods herein may be embodied as a system, method, or computer program product. Accordingly, aspects of the present disclosure may take the form of an entirely hardware system, an entirely software system (including firmware, resident software, micro-code, etc.) or an system combining software and hardware aspects that may all generally be referred to herein as a "circuit," "module", or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a Read-Only Memory (ROM), an Erasable Programmable Read-Only Memory (EPROM or Flash memory), an optical fiber, a magnetic storage device, a portable compact disc Read-Only Memory (CD-ROM), an optical storage device, a "plug-and-play" memory device, like a USB flash drive, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The flowchart and block diagrams in the Figures illustrate the architecture, functionality, and operation of possible implementations of systems, methods, and computer program products according to various systems and methods herein. In this regard, each block in the flowchart or block diagrams may represent a module, segment, or portion of code, which includes one or more executable instructions for implementing the specified logical function(s). It should also be noted that, in some alternative implementations, the functions noted in the block might occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Deployment types include loading directly in the client, server, and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Alternatively, the process software is sent directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

While it is understood that the process software may be deployed by manually loading directly in the client, server, and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

The terminology used herein is for the purpose of describing particular systems and methods only and is not intended to be limiting of this disclosure. As used herein, the singular forms "a", "an", and "the" are intended to include the plural forms as well, unless the context clearly indicates otherwise. It will be further understood that the terms "comprises", "comprising", "includes", and "including", when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various systems and methods herein have been presented for purposes of illustration, but are not intended to be exhaustive or limited to the systems and methods disclosed. Many modifications and variations will be apparent to those of ordinary skill in the art without departing from the scope and spirit of the described systems and methods. The terminology used herein was chosen to best explain the principles of the systems and methods, the practical application or technical improvement over technologies found in the marketplace, or to enable others of ordinary skill in the art to understand the systems and methods disclosed herein.

What is claimed is:

1. A structure, comprising:
a memory array; and
a read data path, comprising:
  a pair of read bit switches connected to the memory array, and
  a pair of sense amps connected to the read bit switches, each sense amp of the pair of sense amps being connected to one of the read bit switches of the pair of read bit switches,
    a first sense amp of the pair of sense amps being connected directly to a first read bit switch of the pair of read bit switches, and
    a second sense amp of the pair of sense amps being connected to a second read bit switch of the pair of read bit switches through a switch,
    the switch providing a data path from the second read bit switch of the pair of read bit switches to the first sense amp of the pair of sense amps.

2. The structure according to claim 1, said memory array comprising one of:
a static random access memory (SRAM) array;
a dynamic random access memory (DRAM) array;
an embedded dynamic random access memory (eDRAM) array;
a magnetoresistive random access memory (MRAM); and
a flash memory array.

3. The structure according to claim 1, further comprising:
an address latch decision block combining the column address (AC) and the address decode (AD) to create signals for the read bit switches.

4. The structure according to claim 1, the read bit switches providing multiplexing of read data signals.

5. The structure according to claim 1, the switch comprising a physical switch.

6. The structure according to claim 1, the switch comprising a logical switch.

7. The structure according to claim 1, further comprising:
a sense amp enable signal (SET) providing a latching signal for the first sense amp and second sense amp.

8. A structure, comprising:
a memory array;
a pair of write drivers connected to the memory array; and
a steering de-multiplexor connected to the pair of write drivers,
  the steering de-multiplexor being directly connected to a first write driver of the pair of write drivers, and
  the steering de-multiplexor being directly connected to a second write driver of the pair of write drivers through switches,
    the switches providing a path from the steering de-multiplexor to both the first write driver of the pair of write drivers and the second write driver of the pair of write drivers and separate direct paths comprising a first path from the steering de-multiplexor to the first write driver of the pair of write drivers and a second path from the steering de-multiplexor to the second write driver of the pair of write drivers.

9. The structure according to claim 8, the memory array comprising one of:
a static random access memory (SRAM) array;
a dynamic random access memory (DRAM) array;
an embedded dynamic random access memory (eDRAM) array;
a magnetoresistive random access memory (MRAM); and
a flash memory array.

10. The structure according to claim 8, further comprising:
an address latch decision block combining the column address (AC) and the address decode (AD); and
a decoder, the address latch decision block being connected to the decoder.

11. The structure according to claim 10, the decoder providing multiplexing signals to the first write driver and second write driver.

12. The structure according to claim 8, the switches comprising a physical switch.

13. The structure according to claim 8, the switches comprising a logical switch.

14. A method, comprising:
providing a memory array;
providing data paths to the memory array, the data path including switches for selectively aligning the data paths to different multiplexors for reading or writing to the memory array;
combining the column address (AC) and the address decode (AD) to create read bit switch (RBS) signals or write bit switch (WBS) signals;

steering read data lines to selected sense amplifiers based on the decode address, using the switches; and steering write data lines to selected write drivers based on the decode address, using the switches.

15. The method according to claim 14, the memory array comprising one of:

a static random access memory (SRAM) array;

a dynamic random access memory (DRAM) array;

an embedded dynamic random access memory (eDRAM) array;

a magnetoresistive random access memory (MRAM); and a flash memory array.

16. The method according to claim 14, the steering read data lines comprising directing output of bit switches to appropriate sense amps according to the RBS signals.

17. The method according to claim 14, the steering write data lines comprising directing write data to appropriate write drivers according to the WBS signals.

18. The method according to claim 14, the switches comprising a physical switch using metal overlays.

19. The method according to claim 14, the switches comprising a logical switch.

\* \* \* \* \*